United States Patent
Kawahara et al.

(10) Patent No.: US 9,742,401 B2
(45) Date of Patent: Aug. 22, 2017

(54) LOW-LEAK POTENTIAL SELECTION CIRCUIT

(71) Applicant: DENSO CORPORATION, Kariya, Aichi-pref. (JP)

(72) Inventors: Shogo Kawahara, Kariya (JP); Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/078,013

(22) Filed: Mar. 23, 2016

(65) Prior Publication Data
US 2016/0373107 A1    Dec. 22, 2016

(30) Foreign Application Priority Data

Jun. 16, 2015   (JP) ................. 2015-121062

(51) Int. Cl.
*H03K 17/00*    (2006.01)
*H03K 17/693*   (2006.01)
*H03M 1/00*     (2006.01)

(52) U.S. Cl.
CPC ............ *H03K 17/693* (2013.01); *H03M 1/00* (2013.01)

(58) Field of Classification Search
CPC .... H03K 17/693; H03K 17/005; H03K 17/74; H03K 17/162; H03K 5/1252; H03K 5/135
See application file for complete search history.

(56) References Cited

U.S. PATENT DOCUMENTS

| | | | |
|---|---|---|---|
| 4,204,131 A * | 5/1980 | Dozier ................. | H03K 17/693 327/408 |
| 7,332,941 B2 | 2/2008 | Ishii | |
| 2005/0219102 A1 | 10/2005 | Ishii | |
| 2008/0218244 A1* | 9/2008 | Oishi .................. | H03F 3/45475 327/389 |
| 2016/0261276 A1* | 9/2016 | Kawahara ............... | H03M 1/66 |

FOREIGN PATENT DOCUMENTS

JP    2005-268895    9/2005

OTHER PUBLICATIONS

U.S. Appl. No. 14/994,564, filed Jan. 13, 2016, Kawahara et al.

* cited by examiner

*Primary Examiner* — Long Nguyen
(74) *Attorney, Agent, or Firm* — Posz Law Group, PLC

(57) ABSTRACT

First and second p-type transistors are connected in series between an output terminal and a positive power terminal. First and second n-type transistors are connected in series between a node and a negative power terminal. A third p-type transistor is connected between a node and the positive power terminal. Third and fourth n-type transistors are connected in series between the output terminal and a low potential terminal. Fourth and fifth p-type transistors are connected in series between a node and the negative power terminal. A fifth n-type transistor is connected between a node and the negative power terminal. A high potential is outputted without leak current when the first to fifth p-type transistors are turned on and the first to fifth n-type transistors are turned off.

3 Claims, 11 Drawing Sheets

LOW-LEAK POTENTIAL SELECTION CIRCUIT

CROSS REFERENCE TO RELATED APPLICATION

The present application is based on Japanese patent application No. 2015-121062 filed on Jun. 16, 2015, the content of which is incorporated herein by reference.

TECHNICAL FIELD

The present disclosure relates to a low-leak potential selection circuit.

BACKGROUND ART

In an over-sampling A/D conversion circuit as a semiconductor integrated circuit, which is, for example, a ΔΣ-type A/D conversion circuit, a potential selection circuit is used as a D/A conversion circuit for feeding back an A/D conversion output. In a bi-level potential selection circuit, a high-potential terminal and a low-potential terminal are provided as potential output terminals. The high-potential terminal VREF+ is set to 3.0V and the low-potential terminal VREF− is set to 0V, for example. A MOS transistor is provided at an output part from each terminal to the potential output terminal so that a potential is outputted to the output terminal through the MOS transistor in response to a corresponding control signal.

However, in recent years, such a circuit for outputting a potential Is affected largely by a characteristic of a MOS transistor such as a MOSFET used as a switching element in a case that an A/D conversion circuit needs an output of high precision with an increased number of bits. When a ratio of on-resistance/off-resistance of the MOS transistor is not satisfactory, a leak current of the MOS transistor tends to cause error in the output potential in its off-state.

For example, in a circuit configuration that MOS transistors are connected as switching elements between the potential output terminal and the high-potential terminal and the low-potential terminal, one and the other of the MOS transistors are turned on and off, respectively, to output either one of the potentials. When the MOS transistor in the off-state has a leak, the output potential includes an error.

To reduce leak current, it is proposed in U.S. Pat. No. 7,332,941 to connect two MOS transistors in series as switching elements and connect a further MOS transistor to fix an intermediate node of these series-connected MOS transistors to another intermediate potential. This configuration is effective to reduce the leak current. However, it needs a potential generation circuit for generating the intermediate potential and necessarily increases a circuit area.

It is alternatively proposed in JP 2005-268895 A to fix Intermediate nodes of a high potential side and a low potential side to a ground level and a power supply voltage level through MOS transistors, respectively. In this configuration, the MOS transistors, which fix the intermediate nodes, generate leak. This leak causes output error.

SUMMARY OF THE DISCLOSURE

It is therefore an object of the present disclosure to provide a low-leak potential selection circuit, which is capable of outputting a potential with high precision while limiting an increase in a circuit area.

A low-leak potential selection circuit comprises: a positive power supply terminal and a negative power supply terminal; a high-potential terminal, a low-potential terminal and an output terminal for outputting a potential; and a high-potential switch and a low-potential switch for selecting a potential of either one of the high-potential terminal and the low-potential terminal in response to a control signal and outputting a selected potential to the output terminal.

According to one aspect, the high-potential switch includes: a first p-type MOS transistor and a second p-type MOS transistor connected in series between the output terminal and the high-potential terminal; a first n-type MOS transistor and a second n-type MOS transistor connected in series between an intermediate node, which is between the first p-type MOS transistor and the second p-type MOS transistor, and the negative power supply terminal; and a third p-type MOS transistor connected between an intermediate node, which is between the first n-type MOS transistor and the second n-type MOS transistor, and the positive power supply terminal. Further, the low-potential switch Includes: a third n-type MOS transistor and a fourth n-type MOS transistor connected in series between the output terminal and the low-potential terminal; a fourth p-type MOS transistor and a fifth p-type MOS transistor connected in series between an intermediate node, which is between the third n-type MOS transistor and the fourth n-type MOS transistor, and the positive power supply terminal; and a fifth n-type MOS transistor connected between an intermediate node, which is between the fourth p-type MOS transistor and the fifth p-type MOS transistor, and the negative power supply terminal.

According to another aspect, the high-potential switch Includes: a first p-type MOS transistor and a second p-type MOS transistor connected in series between the output terminal and the high-potential terminal; a first n-type MOS transistor and a sixth p-type MOS transistor connected in series between an Intermediate node, which is between the first p-type MOS transistor and the second p-type MOS transistor, and the negative power supply terminal. Further, the high-potential switch includes: a third n-type MOS transistor and a fourth n-type MOS transistor connected in series between the output terminal and the low-potential terminal; and a fourth p-type MOS transistor and a sixth n-type MOS transistor connected in series between an intermediate node, which is between the third n-type MOS transistor and the fourth n-type MOS transistor, and the positive power supply terminal.

DETAILED DESCRIPTION OF THE EMBODIMENT

First Embodiment

A first embodiment of a low-leak potential selection circuit will be described below with reference to FIG. 1 to FIG. 3. The low-leak potential selection circuit is used in a D/A conversion circuit 1 in an A/D conversion circuit 2, which are shown in FIG. 2.

Figure 2:
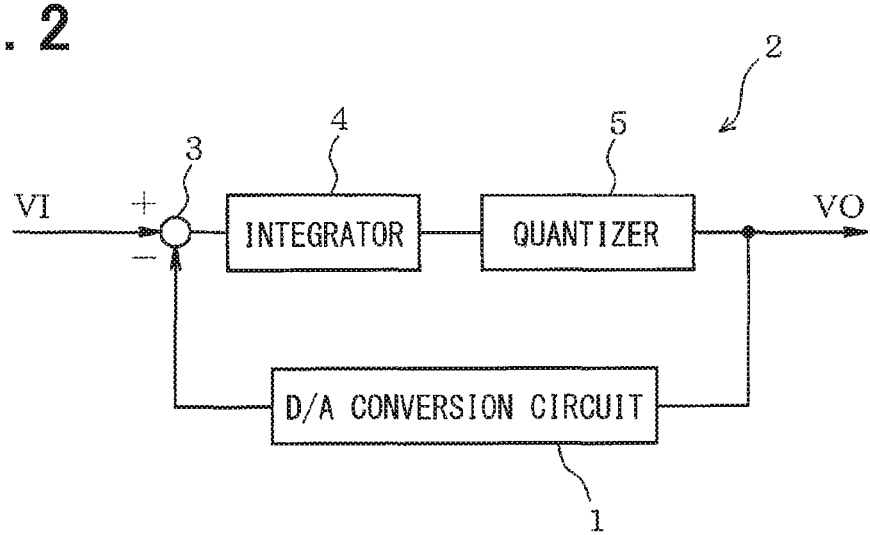
FIG. 2 is an electric circuit diagram of an A/D conversion circuit, which uses the low-leak potential selection circuit.

Specifically, the A/D conversion circuit 2 shown in FIG. 2 is a first-order delta-sigma ($\Delta\Sigma$) A/D conversion circuit, to which the D/A conversion circuit 1 is applied as the low-leak potential selection circuit. In this configuration, an analog input signal VI is inputted as an addition signal to a subtractor 3 and an output signal produced as a result of subtraction is inputted to an integrator 4.

The Integrator 4 is connected to a quantizer 5, which outputs a digital output signal VO. The output signal VO of the quantizer 5 is inputted as a subtraction signal to the subtractor 3 through the D/A conversion circuit 1.

The A/D conversion circuit 2 configured as described above converts the analog input signal VI by $\Delta\Sigma$-modulation and outputs the digital output signal VO. The D/A conversion circuit 1 is configured to select either one of two potentials, which are a high potential VREF+ and a low potential VREF−, in accordance with the output signal VO and outputs the selected potential as the analog output. The high potential VREF+ and the low potential VREF− are set to 3.0V and 0V, respectively, for example.

Figure 1:
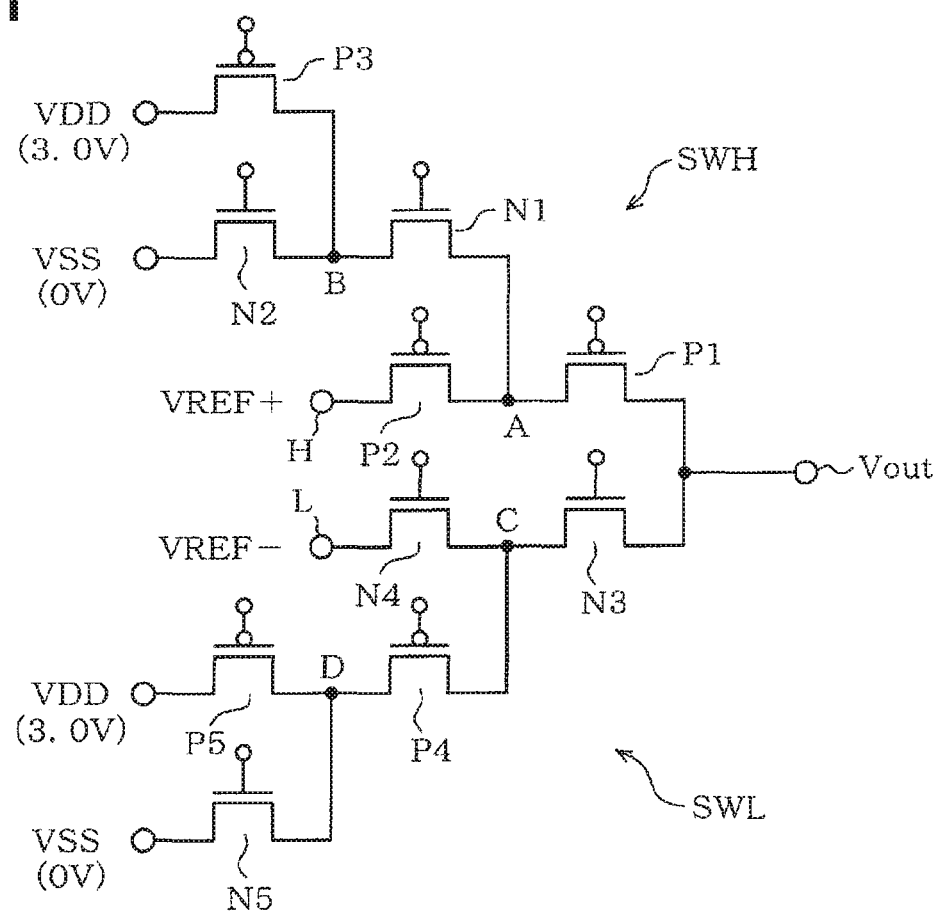
FIG. 1 is an electric circuit diagram showing a first embodiment of a low-leak potential selection circuit.

The D/A conversion circuit 1 is configured as shown in FIG. 1. The D/A conversion circuit 1 is a bi-level type and has a high-potential terminal H and a low-potential terminal L as two terminals as well as an output terminal Vout. A high-potential power supply is connected to the high-potential terminal H and supplies the high potential VREF+ (3.0V). A low-potential power supply is connected to the low-potential terminal L and supplies the low potential VREF− (0V).

The high potential VREF+ and the low potential VREF− are generated by a potential generation circuit (not shown) with the potential 3.0V of a positive power supply terminal VDD and the potential 0V of a negative power supply terminal VSS as references, respectively. A high-potential switch SWH is connected between the output terminal Vout and the high-potential terminal H. A low-potential switch SWL is connected between the output terminal Vout and the low-potential terminal L.

The high-potential switch SWH is configured as described below. A first p-type MOS transistor P1 and a second p-type MOS transistor P2 are connected in series between the output terminal Vout and the high-potential terminal H. A first n-type MOS transistor N1 and a second n-type MOS transistor N2 are connected in series between the negative power supply terminal VSS and an intermediate node A, which is between the first p-type MOS transistor P1 and the second p-type MOS transistor P2. A third p-type MOS transistor P3 is connected between the positive power supply terminal VDD and an intermediate node B, which is between the first n-type MOS transistor N1 and the second n-type MOS transistor N2.

The low-potential switch SWL is configured as described below. A third n-type MOS transistor N3 and a fourth n-type MOS transistor N4 are connected in series between the output terminal Vout and the low-potential terminal VREF−. A fourth p-type MOS transistor P4 and a fifth p-type MOS transistor P5 are connected in series between the positive power supply terminal VDD and an intermediate node C, which is between the third n-type MOS transistor N3 and the fourth n-type MOS transistor N4. A fifth n-type MOS transistor N5 is connected between the negative power supply terminal VSS and an intermediate node D, which is between the fourth p-type MOS transistor P4 and the fifth p-type MOS transistor P5.

Although not shown in the figure, the D/A conversion circuit 1 includes a control circuit, which is configured to supply on-off signals for the first to fifth p-type MOS transistors P1 to P5, the first to fifth n-type MOS transistors N1 to N5 thereby to select the potential to be outputted in accordance with the output signal VO outputted from the quantizer 5.

In the configuration described above, potentials of the high potential VREF+, the low potential VREF−, the positive power supply terminal VDD and the negative power supply terminal VSS are set to satisfy a predetermined relation expressed by the following relation.

$$VDD \geq VREF+ > VREF- \geq VSS$$

In the first embodiment, the voltage of the positive power terminal VDD and the high potential VREF+ are set equally to 3.0V and the low potential VREF− and the voltage of the negative power supply terminal VSS are set equally to 0V.

Figure 3A:
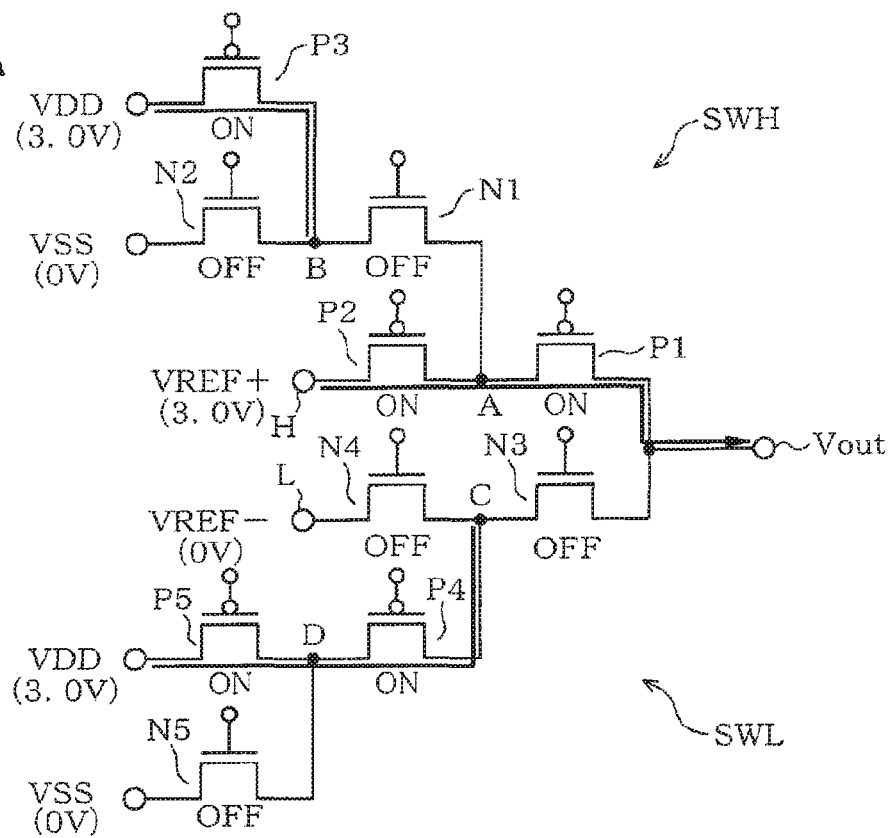
FIG. 3A and FIG. 3B are electric circuit diagrams showing operation states of the first embodiment when a high potential VREF+ and a low potential VREF− are outputted, respectively.
Figure 3B:
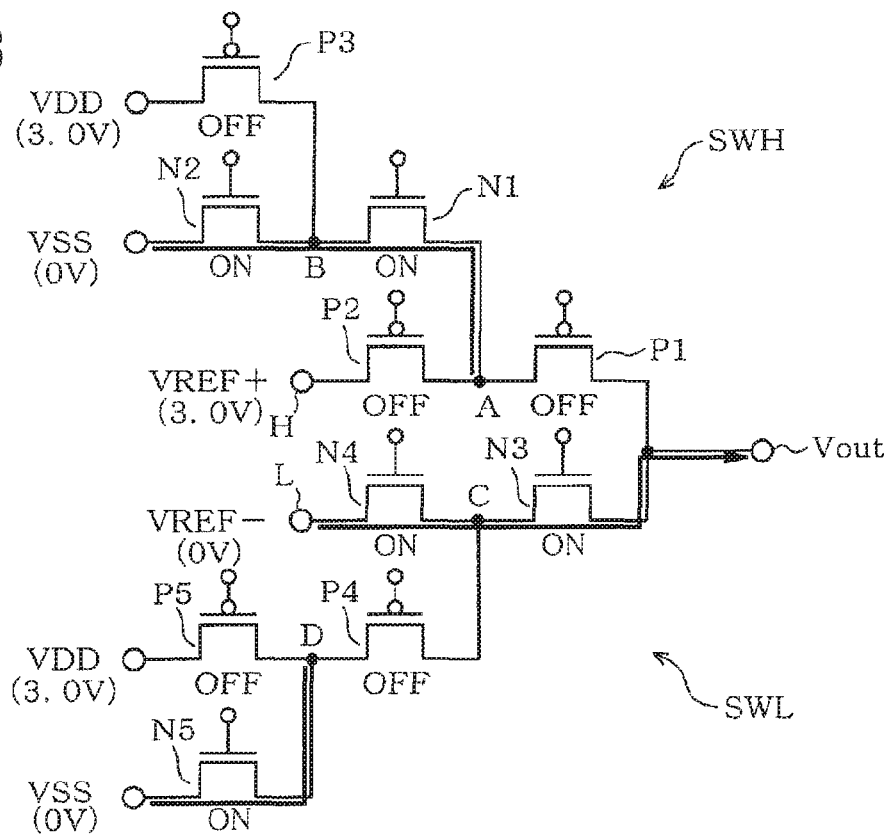

An operation of the D/A conversion circuit 1 will be described below with reference to FIG. 3A and FIG. 3B. The D/A conversion circuit 1 outputs its output voltage selectively in accordance with the output signal VO or the state of the quantizer 5. FIG. 3A shows a state of the D/A conversion circuit 1 at the time of outputting the high potential, that is, when the high-potential switch SWH and the low-potential switch SWL are in an on-state and an off-state, respectively. FIG. 3B shows a state of the D/A conversion circuit 1 at the time of outputting the low potential, that is, when the high-potential switch SWH and the low-potential switch SWL are in an off-state and an on-state, respectively. In FIG. 3A and FIG. 3B, a bold solid line indicates a conductive state indicating that conductive paths are generally at the same potential.

Referring first to FIG. 3A, the high potential VREF+ is outputted from the high-potential terminal H to the output terminal Vout by turning on the high-potential switch SWH and turning off the low-potential switch SWL. For outputting the high potential VREF+, all of the first to fifth p-type MOS transistors P1 to P5 are turned on and all of the first to fifth n-type MOS transistors N1 to N5 are turned off.

Thus the high potential VREF+ is outputted from the high-potential terminal H to the output terminal Vout through the second p-type MOS transistor P2 and the first p-type MOS transistor P1. At this time, the potential at the intermediate node A between the first p-type MOS transistor P1 and the second p-type MOS transistor P2 is generally the high potential VREF+. The first n-type MOS transistor N1 and the second n-type MOS transistor N2, which are connected to the intermediate node A, are in off-states. The third p-type MOS transistor P3 connected to the intermediate node B between the first n-type MOS transistor N1 and the second n-type MOS transistor N2 is in on-states.

For this reason, potentials of both terminals of a source and a drain of the first n-type MOS transistor N1 in the off-state are the high potential VREF+ at the Intermediate node A side and a potential of the positive power supply terminal VDD at the Intermediate node B side. Since both potentials are generally equal to each other, the potential difference between its source and drain is almost nil. Since the first n-type MOS transistor N1 thus has almost no potential difference between the source and the drain irrespective of an off-resistance value, almost no leak current is generated. As a result, it is possible to suppress current from leaking from the intermediate node A between the first p-type MOS transistor P1 and the second p-type MOS transistor P2 to the first n-type MOS transistor N1 side. The high potential VREF+ can be outputted with high precision by suppressing the leak current from flowing from the high-potential terminal H to the output terminal Vout.

Since the third n-type MOS transistor N3 and the fourth n-type MOS transistor N4 are in the off-states, the low-potential terminal L and the output terminal Vout are interrupted from each other. Since the fourth p-type MOS transistor P4 and the fifth p-type MOS transistor P5 are in on-states at this time, the intermediate node C between the third n-type MOS transistor N3 and the fourth n-type MOS transistor N4 are at the potential of the positive power supply terminal VDD. For this reason, potentials of both terminals of a source and a drain of the third n-type MOS transistor N3 in the off-state are the high potential VREF+ at the output terminal Vout side and a potential of the positive power supply terminal VDD at the intermediate node C side. Since both potentials are generally equal to each other, the potential difference between its drain and source is almost nil. As a result, it is possible to suppress current from leaking from the output terminal Vout to the low-potential terminal L side through the third n-type MOS transistor N3. The high potential VREF+ of the output terminal Vout can be outputted with high precision.

Referring next to FIG. 3B, the low potential VREF− is outputted from the low-potential terminal L to the output terminal Vout by turning on the low-potential switch SWL and turning off the high-potential switch SWL. For outputting the low potential VREF−, all of the first to fifth n-type MOS transistors N1 to N5 are turned on and all of the first to fifth p-type MOS transistors P1 to P5 are turned off.

Thus the low potential VREF− is outputted from the low-potential terminal L to the output terminal Vout through the fourth n-type MOS transistor N4 and the third n-type MOS transistor N3. At this time, the potential at the intermediate node C between the third n-type MOS transistor N3 and the fourth n-type MOS transistor N4 is generally the low potential VREF−. The fourth p-type MOS transistor P4 and the fifth p-type MOS transistor P5, which are connected to the intermediate node C, are in off-states. The fifth n-type MOS transistor N5 connected to the intermediate node D between the fourth p-type MOS transistor P4 and the fifth p-type MOS transistor P5 is in on-state.

For this reason, potentials of both terminals of a source and a drain of the fourth p-type MOS transistor P4 in the off-state are the low potential VREF− at the intermediate node C side and a potential of the negative power supply terminal VDD at the intermediate node D side. Since both potentials are generally equal to each other, the potential difference is almost nil. Since the fourth p-type MOS transistor P4 thus has almost no potential difference between the source and the drain irrespective of an off-resistance value, almost no leak current is generated. As a result, it is possible to suppress current from leaking from the intermediate node D side through the fourth p-type MOS transistor P4. The low potential VREF− of the low-potential terminal L side can be maintained at the output terminal Vout.

Since the first p-type MOS transistor P1 and the second p-type MOS transistor P2 are in the off-states, the high-potential terminal H and the output terminal Vout are interrupted from each other. Since the first n-type MOS transistor N1 and the second n-type MOS transistor N2 are in the on-states at this time, the intermediate node A between the first p-type MOS transistor P1 and the second p-type MOS transistor P2 are at the potential of the negative power supply terminal VSS. For this reason, potentials of both terminals of a source and a drain of the first p-type MOS transistor P1 in the off-state are the low potential VREF− at the output terminal Vout side and a potential of the negative power supply terminal VSS at the intermediate node A side. Since both potentials are generally equal to each other and the potential difference is almost nil, almost no leak current is generated. As a result, it is possible to suppress current from leaking from the high-potential terminal H side to the output terminal Vout through the first p-type MOS transistor P1. The low potential VREF− of the output terminal Vout can be outputted with high precision.

According to the present embodiment described above, in any states of the high-potential terminal H and the low-potential terminal L, the high potential VREF+ or the low potential VREF− can be maintained surely as the potential of the output terminals. Further, since the high-potential switch SWH and the low-potential switch SWL are configured as combinations of the p-type MOS transistors and the n-type MOS transistors, circuits for generating an intermediate potential need not be provided. It is thus possible to suppress an increase in the number of circuit elements.

Second Embodiment

Figure 4:
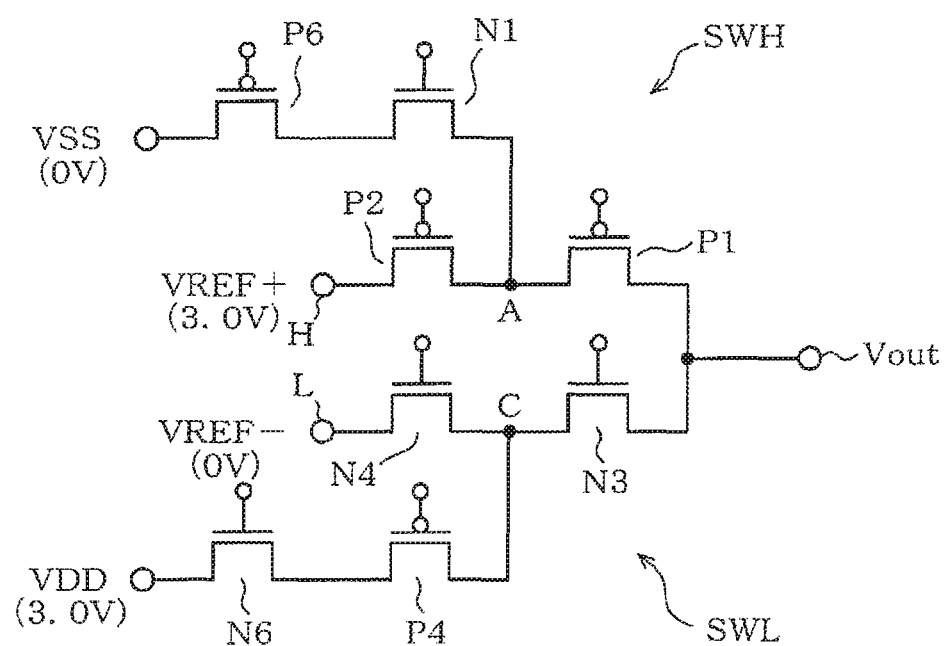
FIG. 4 is an electric circuit diagram showing a second embodiment of the low-leak potential selection circuit.
Figure 5A:
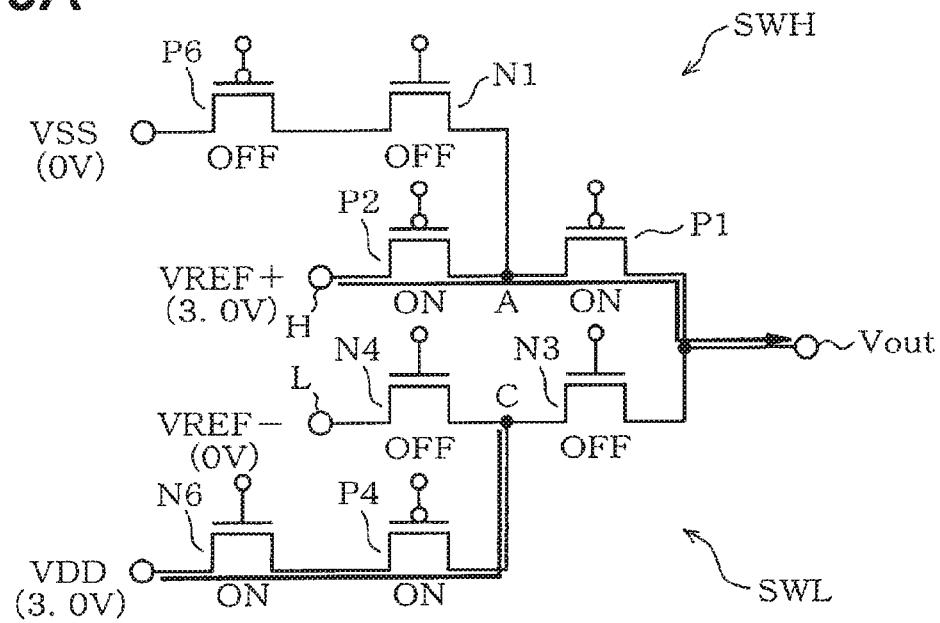
FIG. 5A and FIG. 5B are electric circuit diagrams showing operation states of the second embodiment when the high potential VREF+ and the low potential VREF− are outputted.

A second embodiment is shown in FIG. 4, FIG. 5A and FIG. 5 and different from the first embodiment as described below. As shown in FIG. 4, a sixth p-type MOS transistor P6 is provided between the first n-type MOS transistor N1 and the negative power supply terminal VSS in place of the second n-type MOS transistor N2 and the third p-type MOS transistor P3 in the configuration of the high-potential switch SWH. Further, a sixth n-type MOS transistor N6 is provided between the fourth p-type MOS transistor P4 and the positive power supply terminal VDD in place of the fifth p-type MOS transistor P5 and the fifth n-type MOS transistor N5 in the configuration of the low-potential switch SWL.

Figure 5B:
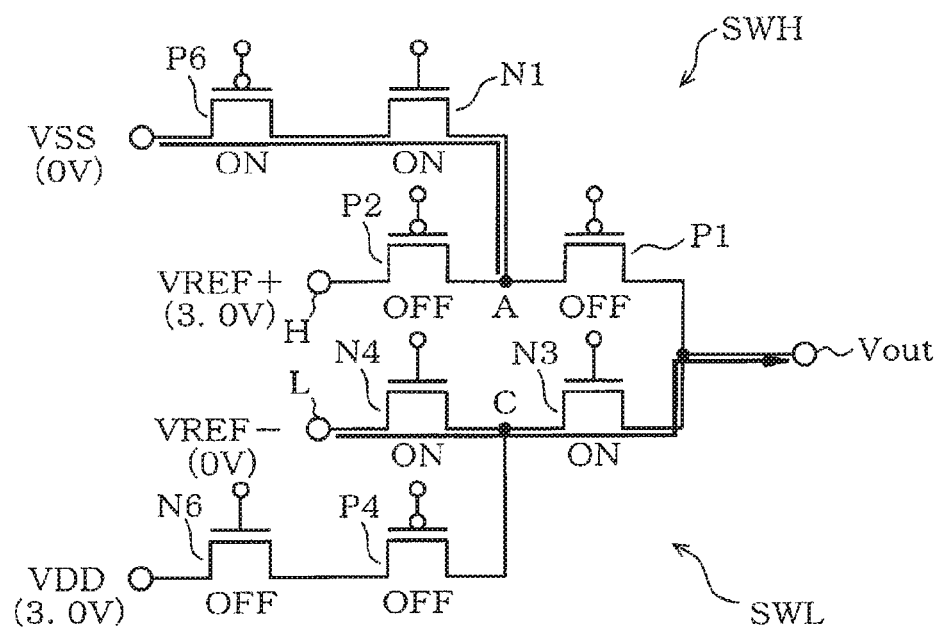

An operation of the second embodiment will be described with reference to FIG. 5A and FIG. 5B. FIG. 5A shows a state when the high potential is outputted and FIG. 5B shows a state when the low potential is outputted. In FIG. 5A and FIG. 5B, a bold solid line indicates a conductive state indicating that conductive paths are generally at the same potential.

Referring first to FIG. 5A, the high potential VREF+ is outputted from the high-potential terminal H to the output terminal Vout by turning on the high-potential switch SWH and turning off the low-potential switch SWL. For outputting the high potential VREF+, the first p-type MOS transistor P1, the second p-type MOS transistor P2, the fourth p-type MOS transistor P4 and the sixth n-type MOS transistor N6 are turned on. The sixth p-type MOS transistor P6, the first n-type MOS transistor N1, the third n-type MOS transistor N3 and the fourth n-type MOS transistor N4 are turned off.

Thus the high potential VREF+ is outputted from the high-potential terminal H to the output terminal Vout through the second p-type MOS transistor P2 and the first p-type MOS transistor P1. At this time, the potential at the intermediate node A between the first p-type MOS transistor P1 and the second p-type MOS transistor P2 is generally the high potential VREF+. The first n-type MOS transistor N1 and the sixth p-type MOS transistor P6, which are connected to the intermediate node A, are in off-states. The potential of the Intermediate node between the first n-type MOS transistor N1 and the sixth p-type MOS transistor P6 is an intermediate potential between the high potential VREF+ and the potential of the negative power supply terminal VSS. The first n-type MOS transistor N1 and the sixth p-type MOS transistor P6 are maintained in the off-states.

Since the third n-type MOS transistor N3 and the fourth n-type MOS transistor N4 are in the off-states, the low-potential terminal L and the output terminal Vout are interrupted from each other. Since the fourth p-type MOS transistor P4 and the sixth n-type MOS transistor N6 are in the on-states at this time, the intermediate node C between the third n-type MOS transistor N3 and the fourth n-type MOS transistor N4 is decreased by an amount of a threshold voltage Vt of the fourth n-type MOS transistor N4 but close to the voltage of the positive power supply terminal VDD. Thus the third n-type MOS transistor N3 is maintained in the off-state. As a result, it is possible to suppress current from leaking from the output terminal Vout to the low-potential terminal L side through the third n-type MOS transistor N3. The high potential VREF+ of the output terminal Vout can be outputted with high precision.

Referring next to FIG. 5B, the low potential VREF− is outputted from the low-potential terminal L to the output terminal Vout by turning on the low-potential switch SWL and turning on the high-potential switch SWH. For outputting the low potential VREF−, the sixth p-type MOS transistor P6, the first n-type MOS transistor N1, the third n-type MOS transistor N3 and the fourth n-type MOS transistor N4 are maintained in on-states. The first p-type MOS transistor P1, the second p-type MOS transistor P2, the fourth p-type MOS transistor P4 and the sixth n-type MOS transistor N6 are maintained in off-states.

Thus the low potential VREF− is outputted from the low-potential terminal L to the output terminal Vout through the fourth n-type MOS transistor N4 and the third n-type MOS transistor N3. At this time, the potential at the intermediate node C between the third n-type MOS transistor N3 and the fourth n-type MOS transistor N4 is generally the low potential VREF−. The sixth n-type MOS transistor N6 and the fourth p-type MOS transistor P4, which are connected to the intermediate node C, are in off-states. The potential of the intermediate node between the sixth n-type MOS transistor N6 and the fourth p-type MOS transistor P4 is an Intermediate potential between the positive power supply terminal VDD and the low potential VREF−. The sixth n-type MOS transistor N6 and the fourth p-type MOS transistor P4 are maintained in the off-states.

Since the first p-type MOS transistor P1 and the second p-type MOS transistor P2 are in the off-states, the high-potential terminal H and the output terminal Vout are interrupted from each other. Since the sixth p-type MOS transistor P6 and the first n-type MOS transistor N1 are in the on-states at this time, the intermediate node A between the first p-type MOS transistor P1 and the second p-type MOS transistor P2 is close to the voltage of the negative power supply terminal VSS. Thus the first p-type MOS transistor P1 is maintained in the off-state. As a result, it is possible to suppress current from leaking from the high-potential terminal H side to the output terminal Vout through the first p-type MOS transistor P1. The low potential VREF− of the output terminal Vout can be outputted with high precision.

As described above, the second embodiment also provides the similar advantage as the first embodiment and reduces the number of circuit elements.

Third Embodiment

Figure 6:
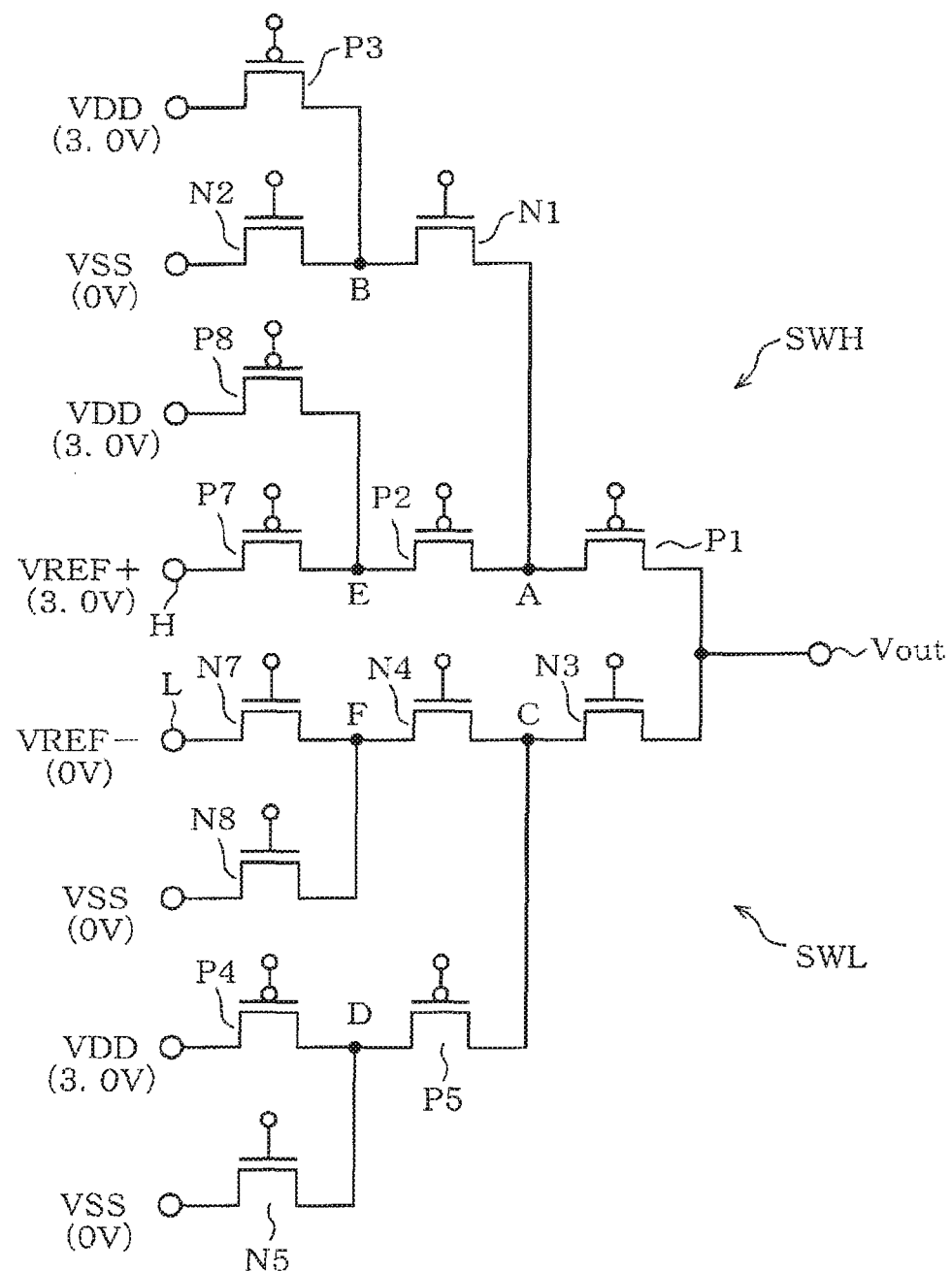
FIG. 6 is an electric circuit diagram showing a third embodiment of the low-leak potential selection circuit.
Figure 7:
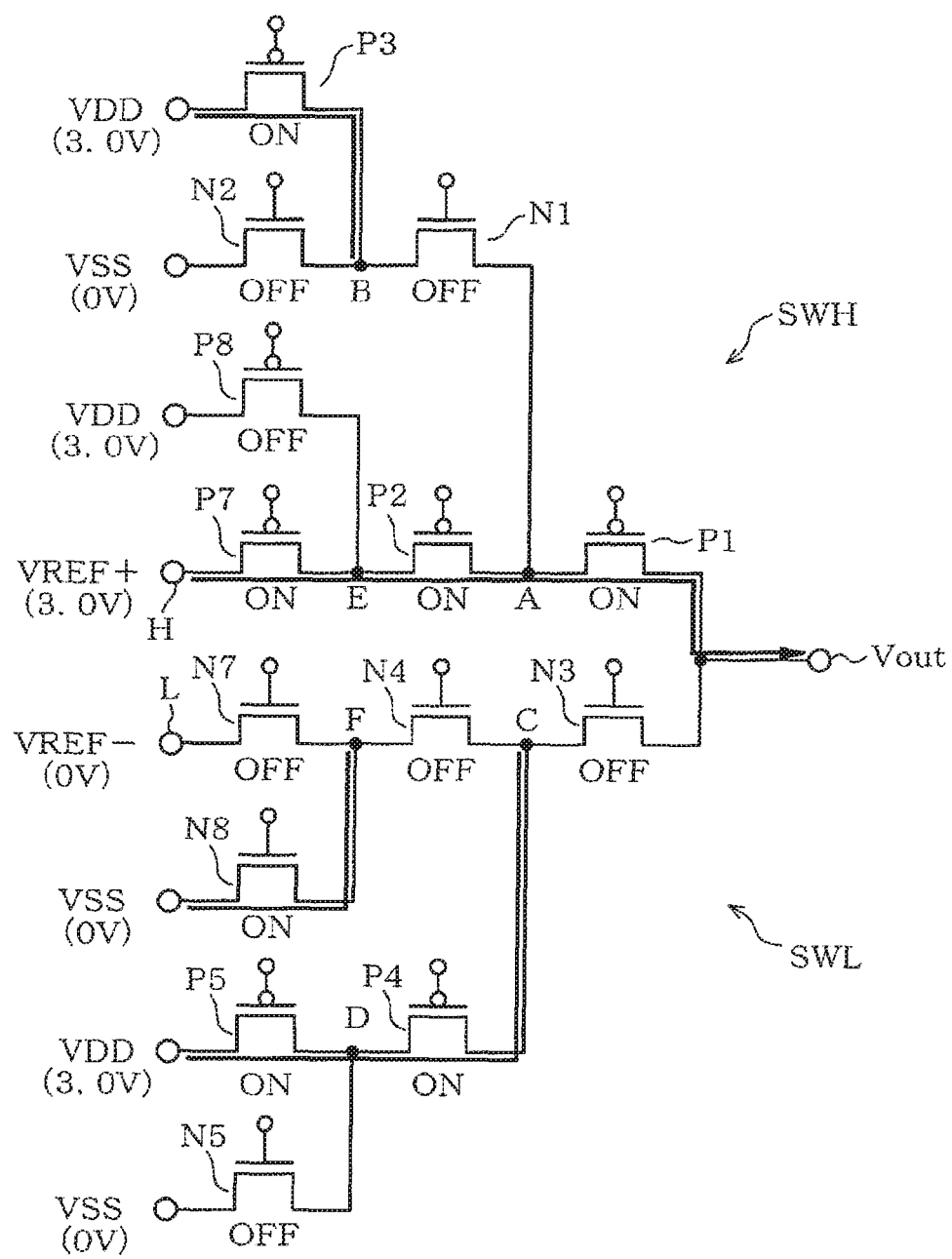
FIG. 7 is an electric circuit diagram showing an operation state of the third embodiment when the high potential VREF+ is outputted.
Figure 8:
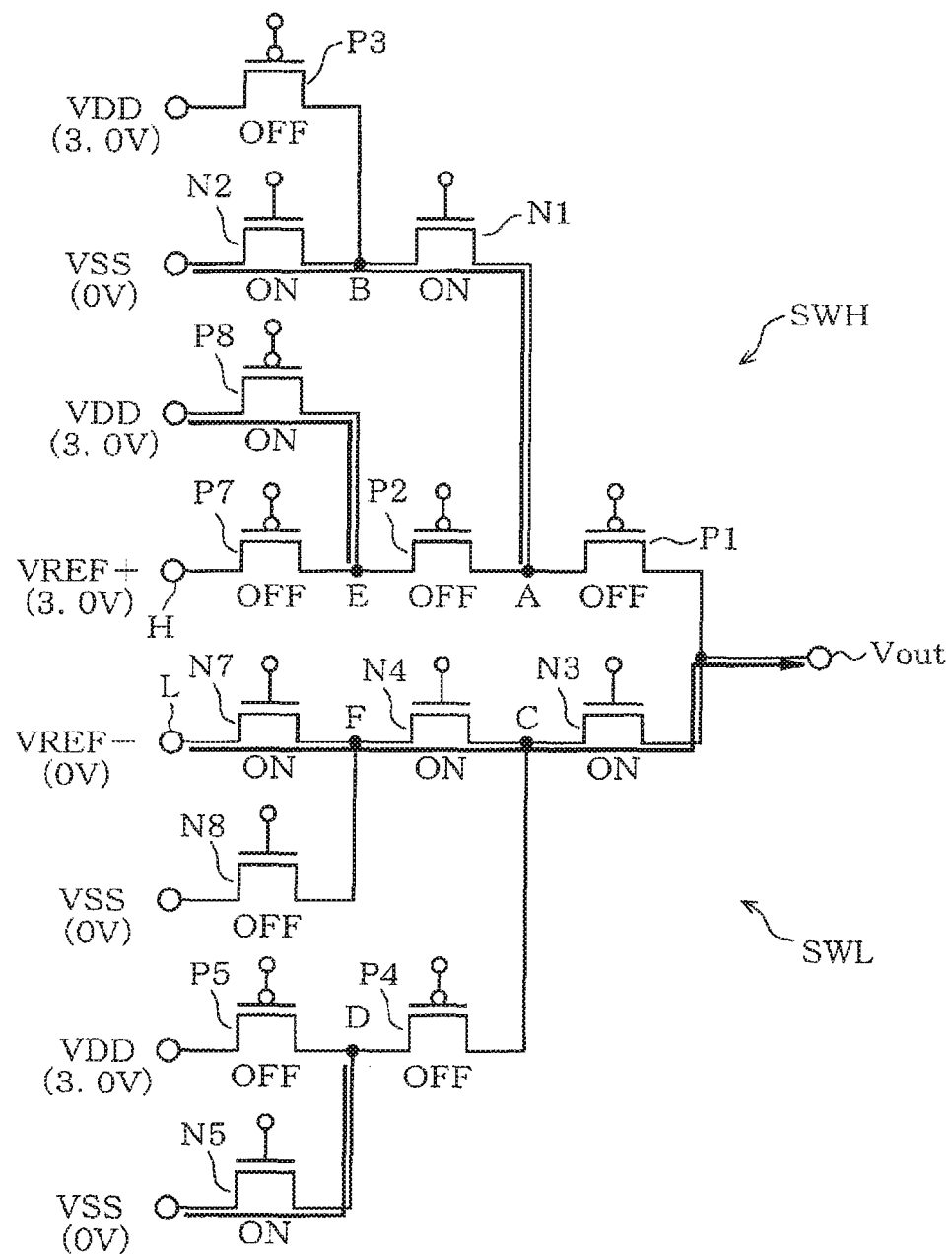
FIG. 8 is an electric circuit diagram showing an operation state of the third embodiment when the low potential VREF− is outputted.

A third embodiment is shown in FIG. 6 to FIG. 8 and different from the first embodiment as described below. As shown in FIG. 6, In the third embodiment, a seventh p-type MOS transistor P7, an eighth p-type MOS transistor P8, a seventh n-type MOS transistor N7 and an eighth n-type MOS transistor N8 are added to the configuration of the first embodiment. The seventh p-type MOS transistor P7 is connected between the high-potential terminal VREF+ and the second p-type MOS transistor P2. The eighth p-type MOS transistor P8 is connected between the positive power supply terminal VDD and an intermediate node E, which is between the second p-type MOS transistor P2 and the seventh p-type MOS transistor P7. The seventh n-type MOS transistor N7 is connected between the low-potential terminal VREF− and the fourth n-type MOS transistor N4. The eighth n-type MOS transistor N8 is connected between the negative power supply terminal VSS and an Intermediate node F, which is between the fourth n-type MOS transistor N4 and the seventh n-type MOS transistor N7.

An operation of the third embodiment will be described with reference to FIG. 7 and FIG. 8. Referring first to FIG. 7, the high potential VREF+ is outputted from the high-potential terminal H to the output terminal Vout by turning on the high-potential switch SWH and turning off the low-potential switch SWL. For outputting the high potential VREF+, the first to fifth p-type MOS transistors P1 to P5, the seventh p-type MOS transistor P7 and the eighth n-type MOS transistor N8 are turned on. The first to fifth n-type MOS transistors N1 to N5, the seventh n-type MOS transistor N7 and the eighth p-type MOS transistor P8 are turned off.

Thus the high potential VREF+ is outputted from the high-potential terminal H to the output terminal Vout through the seventh p-type MOS transistor P7, the second p-type MOS transistor P2 and the first p-type MOS transistor P1. At this time, the potentials at the intermediate nodes A and E are generally the high potential VREF+. Regarding the intermediate node A, since the first n-type MOS transistor N1 has almost no potential difference between its source and drain irrespective of the off-resistance value similarly to the first embodiment, almost no leak current is generated. Regarding the intermediate node E, since the high potential VREF+ and the voltage of the positive power supply terminal VDD are applied to a source and a drain of the eighth p-type MOS transistor P8, no leak current is generated irrespective of the off-resistance value.

Thus no leak current is generated at the intermediate nodes A and E. As a result, the leak current is suppressed from flowing from the high-potential terminal H to the output terminal Vout and the high potential VREF+ can be outputted with high precision.

Since the third n-type MOS transistor N3, the fourth n-type MOS transistor N4 and the seventh n-type MOS transistor N7 are in the off-states, the low-potential terminal L and the output terminal Vout are interrupted from each other. Since the fourth p-type MOS transistor P4 and the fifth p-type MOS transistor P5 are in the on-states, the potential at the intermediate node C between the third n-type MOS transistor N3 and the fourth n-type MOS transistor N4 equals the potential of the positive power supply terminal VDD. Thus potentials of the source terminal and the drain terminal of the third n-type MOS transistor N3 in the off-state are the high potential VREF+ at the output terminal Vout side and potential of the positive power supply terminal VDD at the intermediate node C side. Since both potentials are generally equal, almost no leak current is generated because of no potential difference.

Since the eighth n-type MOS transistor N8 is in the on-state, a potential at the intermediate node F between the fourth n-type MOS transistor N4 and the seventh n-type MOS transistor N7 becomes close to the potential of the negative power supply terminal VSS. Thus potentials of the source terminal and the drain terminal of the seventh n-type MOS transistor N7 in the off-state are the low potential VREF− at the low-potential terminal L side and potential of the negative power supply terminal VSS at the intermediate node F side. Since both potentials are generally equal, almost no leak current is generated because of no potential difference.

Further, a potential of the n-type MOS transistor N4 in the off-state becomes close to the potential of the positive power supply terminal VDD at the intermediate node C side and close to the negative power supply terminal VSS at the intermediate node F side. As a result, leak current is likely to flow. However this leak current flows from the positive power supply terminal VDD to the fifth p-type MOS transistor P5 and from the fourth p-type MOS transistor P4 to the intermediate node C. Then it flows in the fourth n-type MOS transistor N4 and flows from the intermediate node F to the negative power supply terminal VSS side through the eighth n-type MOS transistor N8. For this reason, the leak current of the fourth n-type MOS transistor N4 flows without any relation to the output terminal Vout and the low-potential terminal L.

As a result, the high potential VREF+ can be outputted from the high-potential terminal H side to the output terminal Vout with high precision. Since no leak current is generated at the low-potential terminal L side, the low potential VREF− can be maintained without fluctuation.

Referring next to FIG. 8, the low potential VREF− is outputted from the low-potential terminal L to the output terminal Vout by turning on the low-potential switch SWL and turning off the high-potential switch SWH. For outputting the low potential VREF−, the first to fifth n-type MOS transistors N1 to N5, the seventh n-type MOS transistor N7 and the eighth p-type MOS transistor P8 are turned on. The first to fifth p-type MOS transistors P1 to P5, the seventh p-type MOS transistor P7 and the eighth n-type MOS transistor N8 are turned off.

Thus the low potential VREF− Is outputted from the low-potential terminal L to the output terminal Vout through the seventh n-type MOS transistor N7, the fourth n-type MOS transistor N4 and the third n-type MOS transistor N3. At this time, the potentials at the intermediate nodes C and F are generally the low potential VREF−. Regarding the intermediate node C, since the fourth p-type MOS transistor P4 has almost not potential difference between the source and the drain Irrespective of the off-resistance value similarly to the first embodiment, almost no leak current is generated. Regarding the intermediate node F, since the high potential VREF+ and the voltage of the positive power supply terminal VDD are applied to the source and the drain of the eighth n-type MOS transistor P8, no leak current Is generated Irrespective of the off-resistance value.

Thus no leak current is generated at the intermediate nodes C and F. As a result, leak current is suppressed from flowing from the low-potential terminal L to the output terminal Vout and the low potential VREF− can be outputted with high precision.

Since the first p-type MOS transistor P1, the second p-type MOS transistor P2 and the seventh p-type MOS transistor P7 are in the off-states, the high-potential terminal H and the output terminal Vout are interrupted from each other. Since the first n-type MOS transistor N1 and the second n-type MOS transistor N2 are in the on-states, the potential at the intermediate node A between the first p-type MOS transistor P1 and the second p-type MOS transistor P2 equals the potential of the negative power supply terminal VSS. Thus potentials of the source terminal and the drain terminal of the first p-type MOS transistor P1 in the off-state are the low potential VREF− at the output terminal Vout side and potential of the negative power supply terminal VSS at the intermediate node A side. Since both potentials are generally equal, almost no leak current is generated because of no potential difference.

Since the eighth p-type MOS transistor P8 is in the on-state, a potential at the intermediate node E between the second p-type MOS transistor P2 and the seventh p-type MOS transistor P7 becomes close to the potential of the positive power supply terminal VDD. Thus potentials of the source terminal and the drain terminal of the seventh p-type MOS transistor P7 in the off-state are the high potential VREF+ at the high-potential terminal H side and potential of the positive power supply terminal VDD at the intermediate node E side. Since both potentials are generally equal, almost no leak current is generated because of no potential difference.

Further, a potential of the second p-type MOS transistor P2 in the off-state becomes close to the potential of the positive power supply terminal VDD at the Intermediate node E side and close to the potential of the negative power supply terminal VSS at the intermediate node A side. As a result, leak current is likely to flow. However this leak current flows from the positive power supply terminal VDD to the intermediate node E through the eighth p-type MOS transistor P8. It then flows to the intermediate node A through the second p-type MOS transistor P2. It further flows from the Intermediate node A to the negative power supply terminal VSS through the second n-type MOS transistor N2. For this reason, the leak current of the second p-type MOS transistor P2 flows without any relation to the output terminal Vout and the high-potential terminal H.

As a result, the low potential VREF− can be outputted from the low-potential terminal L side to the output terminal Vout with high precision. Since no leak current is generated at the high-potential terminal H side, the high potential VREF+ can be maintained without fluctuation.

According to the third embodiment described above, any one of the high potential VREF+ of the high-potential terminal H and the low potential VREF− of the low-potential terminal L does not generate leak current depending on the output state. For this reason, the third embodiment can maintain the output state relative to other circuits with high precision in addition to the advantage of the first embodiment.

Fourth Embodiment

Figure 9:
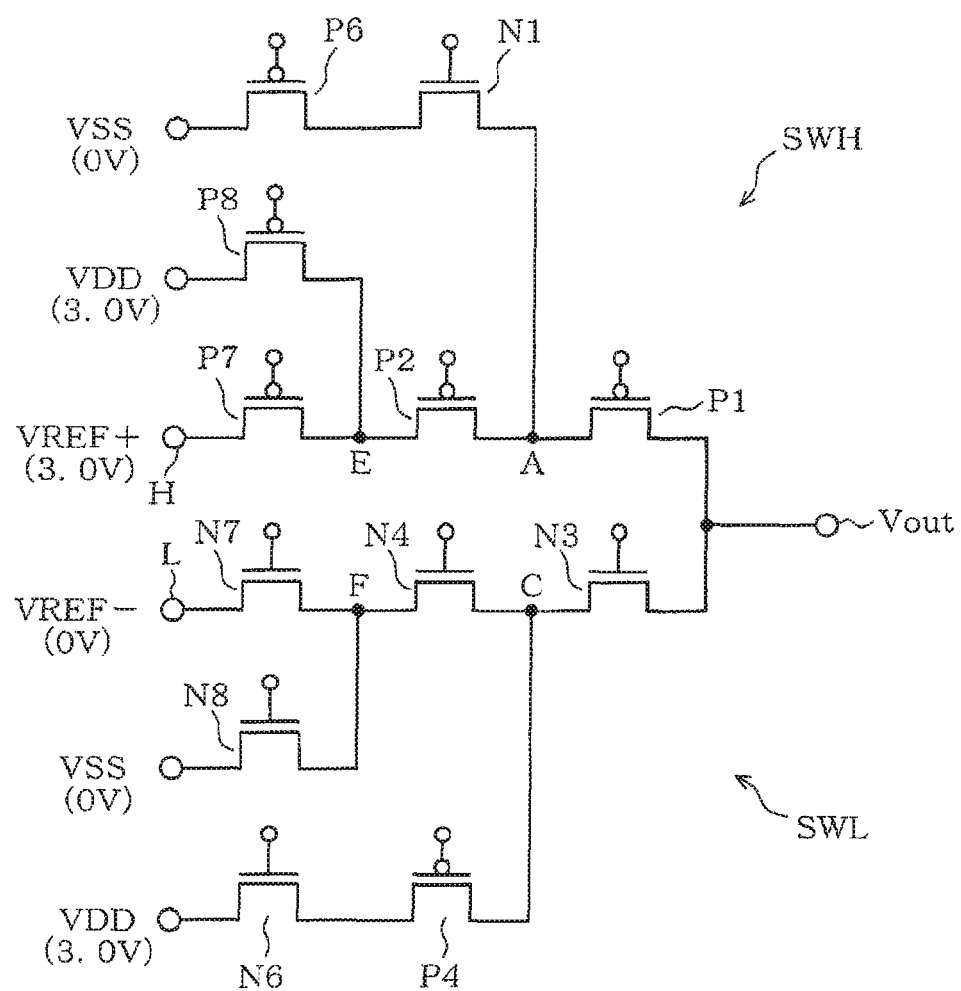
FIG. 9 is an electric circuit diagram showing a fourth embodiment of the low-leak potential selection circuit.

A fourth embodiment is shown in FIG. 9 and different from the second embodiment shown in FIG. 4 as described below. That is, the seventh p-type MOS transistor P7, the eighth p-type MOS transistor P8, the seventh n-type MOS transistor N7 and the eighth n-type MOS transistor N8, which are additionally provided in the third embodiment, are added. The fourth embodiment also provides the advantage of the third embodiment in addition to the advantage of the second embodiment.

Fifth Embodiment

Figure 10:
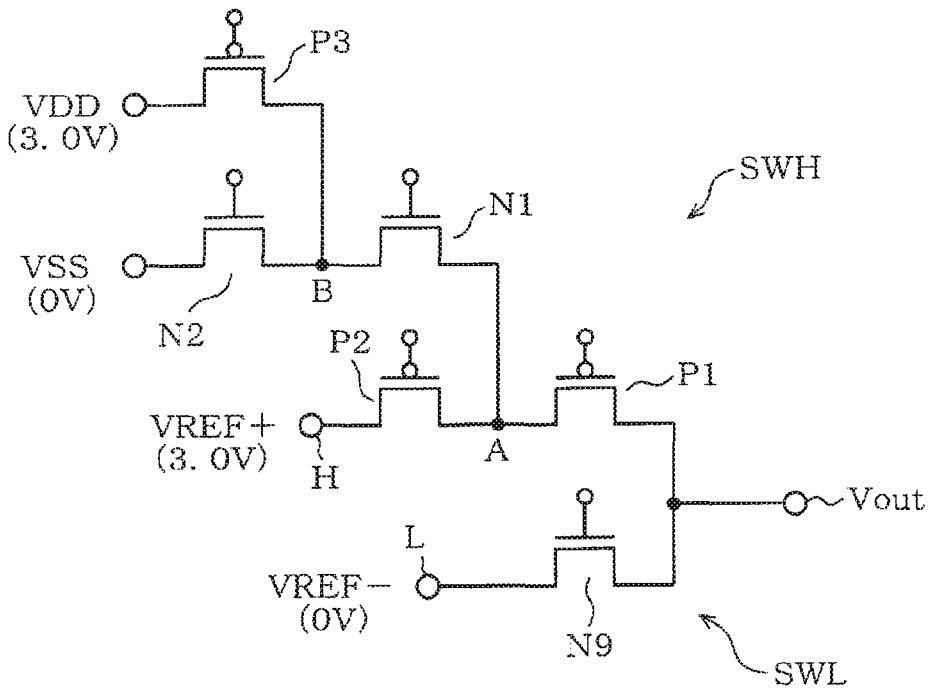
FIG. 10 is an electric circuit diagram showing one part of a fifth embodiment of the low-leak potential selection circuit.
Figure 11:
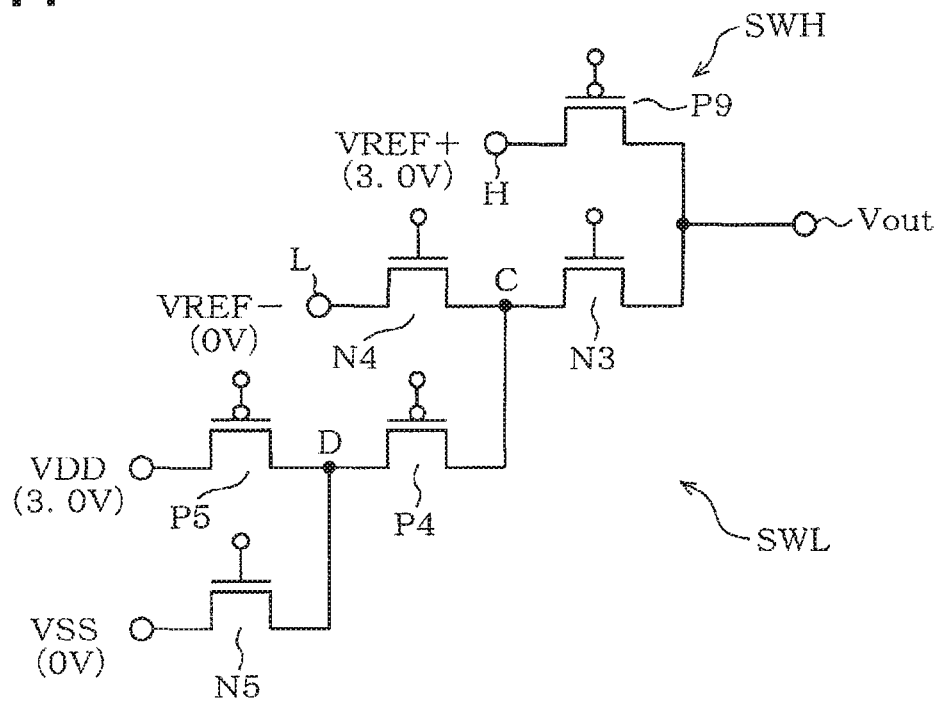
FIG. 11 is an electric circuit diagram showing the other part of the fifth embodiment of the low-leak potential selection circuit.

A fifth embodiment is shown in FIG. 10 and FIG. 11 and is different from the first embodiment as described below. In a configuration shown in FIG. 10, the high-potential switch SWH of the first embodiment is used as the high-potential switch SWH and a ninth n-type MOS transistor N9 is used singly as the low-potential switch SWL. This configuration is suitable for a case that the leak current of the low-potential switch SWL is small and the on-resistance and off-resistance of the third n-type MOS transistor N3 do not affect on the output terminal Vout.

In a configuration shown in FIG. 11, the low-potential switch SWL of the first embodiment is used as the low-potential switch SWL and a ninth p-type MOS transistor P9 is used singly as the high-potential switch SWH. This configuration is suitable for a case that the leak current of the high-potential switch SWH is small and the on-resistance and off-resistance of the first p-type MOS transistor P1 does not affect on the output terminal Vout.

Accordingly, the fifth embodiment also provides the similar operation and advantage as provided by the configuration of the high-potential switch SWH or the low-potential switch SWL of the first embodiment.

Sixth Embodiment

Figure 12:
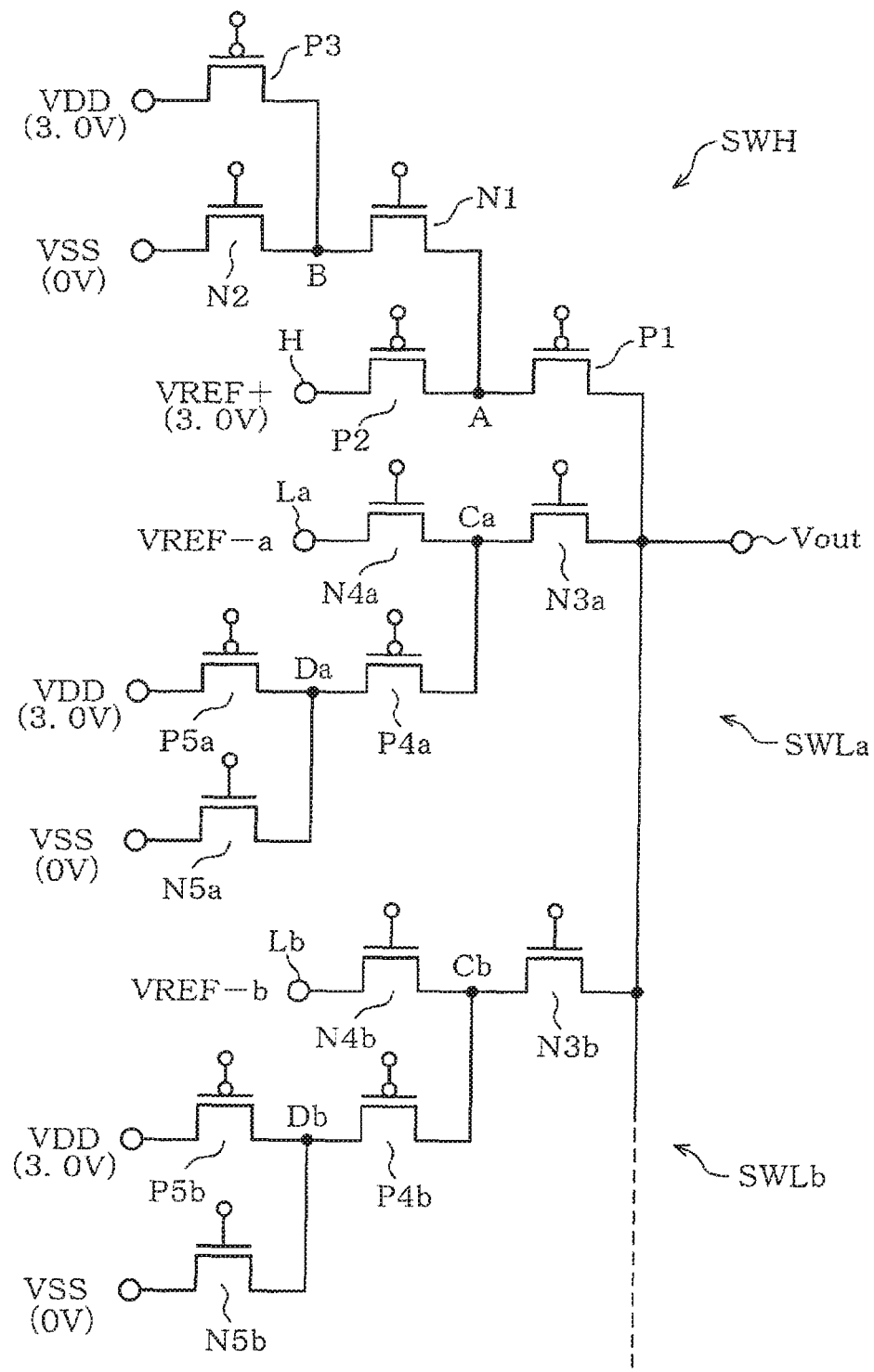
FIG. 12 is an electric circuit diagram showing a sixth embodiment of the low-leak potential selection circuit.

A sixth embodiment is shown in FIG. 12 and different from the first embodiment as described below. Relative to one high output potential VREF+, plural low output potentials VREF-a to VREF-n ("n" Is an alphabet following "b" in alphabetical order) are outputted. The lowest potential VREF-n is set to 0V similarly to the low potential VREF− in the first embodiment. The low potentials VREF-a and VREF-b are higher than the low potential VREF-n but set to be lower than 1.5V. That is, the low potentials VREF-a and VREF-b are set to be smaller than the intermediate level 1.5V between the high potential VREF+ and the low potential VREF-n and different potentials on the low potential VREF-n side.

In this case, the low potential VREF-a is connected to a low-potential terminal La and the low potential VREF-b is connected to the low-potential terminal Lb. Further, low-potential switches SWLa to SWLn (not shown) are connected between the low-potential terminals La, Lb and the output terminal Vout in the similar configuration as the first embodiment.

For this reason, the sixth embodiment, which is provided with plural low potentials VREF-a to VREF-n, also provides the similar advantage as the first embodiment.

Seventh Embodiment

Figure 13:
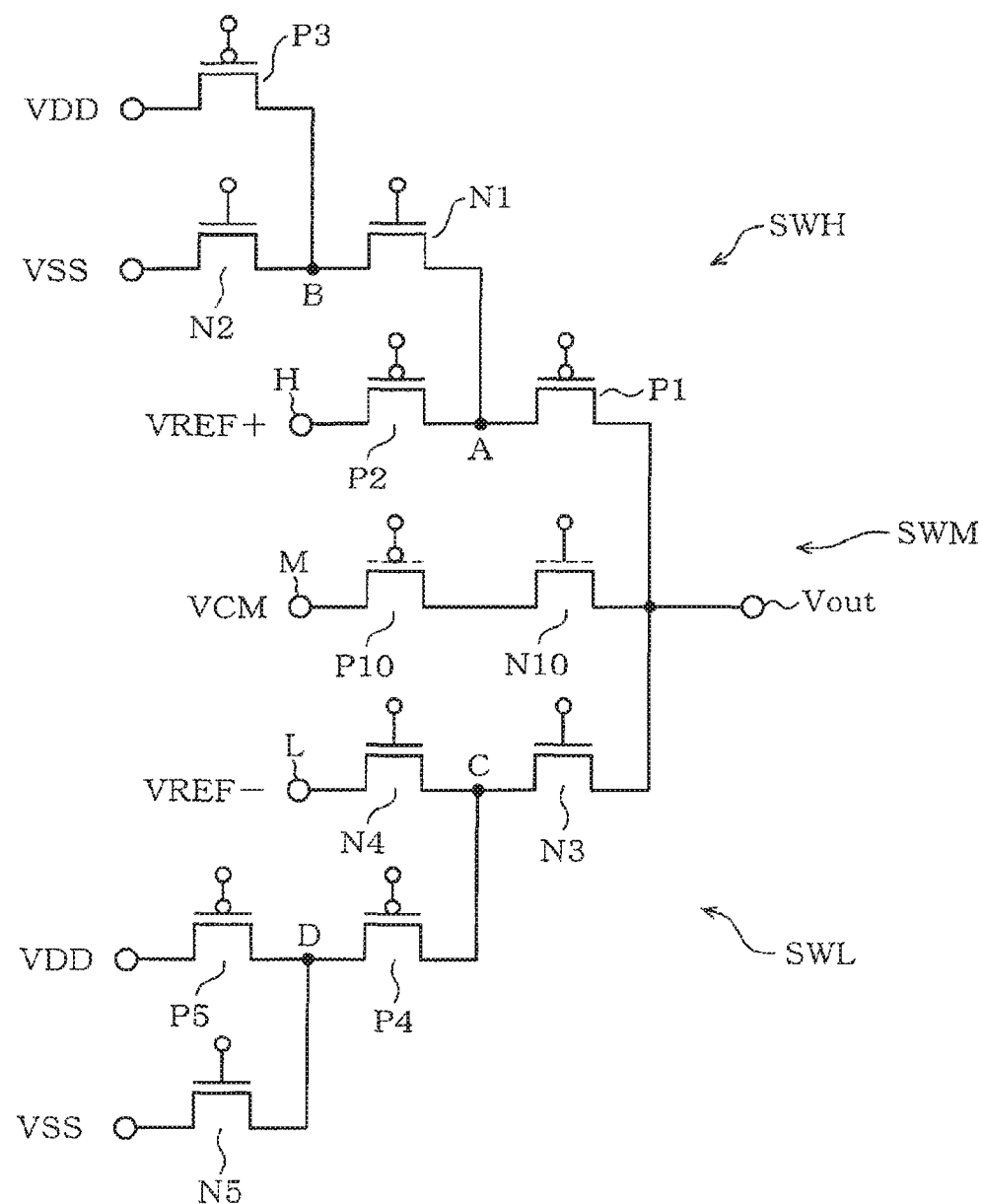
FIG. 13 is an electric circuit diagram showing a seventh embodiment of the low-leak potential selection circuit.

A seventh embodiment is shown in FIG. 13 and different from the first embodiment as described below. In addition to the high-potential terminal H and the low-potential terminal L, an intermediate terminal M is provided to be capable of outputting an intermediate potential VCM (1.5V).

In the seventh embodiment, an intermediate-potential switch SWM for outputting the Intermediate potential VCM is added between the intermediate-potential terminal M and the output terminal Vout. The intermediate-potential switch SWM includes a tenth p-type MOS transistor P10 of a low threshold voltage at the intermediate-potential terminal M side and a tenth n-type MOS transistor N10 of a low threshold voltage at the output terminal Vout side. The tenth p-type MOS transistor P10 and the tenth n-type MOS transistor N10 are connected in series. These tenth p-type MOS transistor P10 and the tenth n-type MOS transistor N10 have threshold voltages, which are lower than those of the first to ninth p-type MOS transistors P1 to P9 or the first to ninth n-type MOS transistors N1 to N9.

For outputting the high potential VREF+, the high-potential switch SWH is turned on and the intermediate-potential switch SWM and the low-potential switch SWL are turned off. At his time, the high-potential switch SWH and the low-potential switch SWL are controlled to turn off by on-off operation in the same manner as in the first embodiment. As for the intermediate potential switch SWM, the tenth p-type MOS transistor P10 is turned on and the tenth n-type MOS transistor N10 is turned off.

Thus, similarly to the first embodiment, the high potential VREF+ is outputted form the high-potential terminal H to the output terminal Vout. In this situation, the intermediate potential switch SWM operates as follows. Since the tenth p-type MOS transistor P10 is in the on-state, the intermediate potential VCM (1.5V) is applied from the intermediate potential terminal M to a source of the tenth n-type MOS transistor N10 and the high potential VREF+(3.0V) is applied from the output terminal Vout to a drain of the tenth n-type MOS transistor N10. Since a gate of the tenth n-type MOS transistor N10 is in the off-state and maintained at 0V, the tenth n-type MOS transistor N10 has a gate-source voltage of −1.5V and is subjected to a substrate biasing effect. As a result, the tenth n-type MOS transistor N10 is maintained surely in the off-state even though the threshold voltage is low. It is thus possible to suppress leak current from leaking from the output terminal Vout side to the intermediate potential terminal M side.

For outputting the low potential VREF−, the low-potential switch SWL is turned on and the intermediate-potential switch SWM and the high-potential switch SWL are turned off. At this time, the low-potential switch SWL and the high-potential switch SWH are controlled to turn off, respectively, by on-off operation in the same manner as in the first embodiment. As for the intermediate potential switch SWM, the tenth n-type MOS transistor N10 is turned on and the tenth n-type MOS transistor P10 is turned off.

Thus, similarly to the first embodiment, the low potential VREF− is outputted form the low-potential terminal L to the output terminal Vout. In this situation, the intermediate potential switch SWM operates as follows. Since the tenth n-type MOS transistor N10 is in the on-state, the intermediate potential VCM (1.5V) is applied from the intermediate potential terminal M to a source of the tenth p-type MOS transistor P10 and the low potential VREF− (0V) is applied from the output terminal Vout to a drain of the tenth n-type MOS transistor N10. Since a gate of the tenth p-type MOS transistor P10 is in the off-state and maintained at the high potential. Thus the tenth p-type MOS transistor P10 has a gate-source voltage of 1.5V and is subjected to a substrate biasing effect. As a result, the tenth p-type MOS transistor P10 is maintained surely in the off-state even though the threshold voltage is low. It is thus possible to suppress leak current from leaking from the intermediate terminal M side to the output terminal Vout side.

For outputting the Intermediate potential VCM, both of the high-potential switch SWH and the low-potential switch SWL are turned off and the intermediate switch SWM is turned on. At this time, the high-potential switch SWH and the low-potential switch SWL are controlled to turn off by on-off operation in the same manner as in the first embodiment. As for the intermediate potential switch SWM, both of the tenth p-type MOS transistor P10 and the tenth n-type MOS transistor N10 are turned on.

Since both of the tenth p-type MOS transistor P10 and the tenth n-type MOS transistor N10 are in the on-states, the intermediate potential VCM is outputted form the intermediate potential terminal M to the output terminal Vout Since both of the high-potential switch SWH and the low-potential switch SWL are maintained in the off-states, none of the high potential VREF+ and the low potential VREF− is outputted.

According to the seventh embodiment, in which the intermediate potential VCM is also outputted, it is possible to output any of the high potential VREF+, the low potential VREF− and the Intermediate potential VCM to the output terminal Vout with reduced leak current and high precision.

Other Embodiment

The low-leak potential selection circuit is not limited to the embodiments described above but may be implemented with the following modifications.

The high-potential switch SWH and the low-potential switch SWL shown in the first to fourth embodiments may be provided in different configurations at the high potential side and the low potential side. In the fifth embodiment, the high-potential switch SWH or the low-potential switch SWL is configured similarly to that of the first embodiment. However, the high-potential switch or the low-potential switch may be configured as shown in the second to fourth embodiments.

In the sixth embodiment, plural low-potential switches SWL are provided. However, plural high-potential switches SWH may be provided similarly. Further, plural high-potential switches SWH and plural low-potential switches SWL may be provided. In addition, other than the high-potential switch SWH and the low-potential switch SWL shown in the first embodiment, the high-potential switch SWH and the low-potential switch SWL shown in the second to fourth embodiments may be used singly or in combination.

In the seventh embodiment, the intermediate potential switch SWM is provided in addition to the configuration shown in the first embodiment. However, the intermediate switch SWM may be provided as well in the second to sixth embodiments.

In the embodiments described above, the low-leak potential selection circuit is exemplarily applied to the first-order ΔΣ-type D/A conversion circuit 1 in a feedback path in the A/D conversion circuit 2. However, it may be applied to the A/D conversion circuit, which is of second or higher order. It may also be applied to an A/D conversion circuit of over-sampling type. It may further be applied to a D/A conversion circuit for an A/D conversion circuit of a cyclic type or pipeline type. Still further, it may be used for a circuit other than the A/D conversion circuit as the D/A conversion circuit or used for a circuit other than the D/A conversion circuit.

The invention claimed is:

1. A low-leak potential selection circuit comprising:
   a positive power supply terminal and a negative power supply terminal;
   a high-potential terminal, a low-potential terminal and an output terminal for outputting a potential; and
   a high-potential switch and a low-potential switch for selecting a potential of either one of the high-potential terminal and the low-potential terminal in response to a control signal and outputting a selected potential to the output terminal,
   wherein the high-potential switch includes:
   a first p-type MOS transistor and a second p-type MOS transistor connected in series between the output terminal and the high-potential terminal;
   a first n-type MOS transistor and a second n-type MOS transistor connected in series between a first intermediate node, which is between the first p-type MOS transistor and the second p-type MOS transistor, and the negative power supply terminal; and
   a third p-type MOS transistor connected between a second intermediate node, which is between the first n-type MOS transistor and the second n-type MOS transistor, and the positive power supply terminal,
   wherein the low-potential switch includes:
   a third n-type MOS transistor and a fourth n-type MOS transistor connected in series between the output terminal and the low-potential terminal;
   a fourth p-type MOS transistor and a fifth p-type MOS transistor connected in series between a third intermediate node, which is between the third n-type MOS transistor and the fourth n-type MOS transistor, and the positive power supply terminal; and
   a fifth n-type MOS transistor connected between a fourth intermediate node, which is between the fourth p-type MOS transistor and the fifth p-type MOS transistor, and the negative power supply terminal.

2. The low-leak potential selection circuit according to claim 1, wherein:
   the high-potential switch further includes a seventh p-type MOS connected between the second p-type MOS transistor and the high-potential terminal, and an eighth p-type MOS transistor connected between a fifth intermediate node, which is between the second p-type MOS transistor and the seventh p-type MOS transistor, and the positive power supply terminal, and
   the low-potential switch further includes a seventh n-type MOS transistor connected between the fourth n-type MOS transistor and the low-potential terminal, and an eighth n-type MOS transistor connected between a sixth intermediate node, which is between the fourth n-type MOS transistor and the seventh n-type MOS transistor, and the negative power supply terminal.

3. The low-leak potential selection circuit according to claim 1, further comprising:
- an intermediate potential terminal for outputting an intermediate potential, which is between a high potential of the high-potential terminal and a low potential of the low-potential terminal; and
- an intermediate potential switch connected to the intermediate potential terminal and the output terminal for selecting the intermediate potential of the intermediate potential terminal to the output terminal in accordance with the control signal,
- wherein the intermediate potential switch includes a series circuit of a p-type MOS transistor, a threshold voltage of which is lower than those of p-type MOS transistors forming the high-potential switch or the low-potential switch, and an n-type MOS transistor, a threshold voltage of which is lower than those of the n-type MOS transistors forming the high-potential switch or the low-potential switch.

* * * * *